(12) United States Patent
Taniguchi

(10) Patent No.: US 6,900,827 B2
(45) Date of Patent: May 31, 2005

(54) OPTICAL RECORDER AND METHOD THEREOF

(75) Inventor: Yukio Taniguchi, Yokohama (JP)

(73) Assignee: Kabushiki Kaisha Ekisho Sentan Gijutsu Kaihatsu Center, Yokohama (JP)

( * ) Notice: Subject to any disclaimer, the term of this patent is extended or adjusted under 35 U.S.C. 154(b) by 0 days.

(21) Appl. No.: 10/241,676

(22) Filed: Sep. 10, 2002

(65) Prior Publication Data

US 2003/0076404 A1 Apr. 24, 2003

(30) Foreign Application Priority Data

Oct. 19, 2001 (JP) ........................................ 2001-322598

(51) Int. Cl.$^7$ ............................. B41J 2/47; G02B 26/02
(52) U.S. Cl. ........................................ 347/255; 347/239
(58) Field of Search ................................ 347/239, 255, 347/225, 224; 359/279, 278, 286

(56) References Cited

U.S. PATENT DOCUMENTS

| 5,754,514 A | 5/1998 | Guerra |
| 5,923,359 A | 7/1999 | Montgomery |
| 2003/0076575 A1 * | 4/2003 | Siappaeris .................. 359/291 |

FOREIGN PATENT DOCUMENTS

| CH | 0202949-4 | 10/2003 | |
| EP | 657760 | * 6/1995 | ........... G02B/26/08 |
| JP | 9-162104 | 6/1997 | |
| JP | 2000-47553 A | 2/2000 | |
| JP | 1292103 | 4/2001 | |
| KR | 2002-56305 | 9/2004 | |
| WO | WO 99/45439 | 9/1999 | |

* cited by examiner

*Primary Examiner*—Huan Tran
(74) *Attorney, Agent, or Firm*—Graybeal Jackson Haley LLP

(57) ABSTRACT

An optical recording art is characterized by converting a light from a light source into a modulated light including an amplitude-modulated light and a phase-modulated light and forming an image of the modulated light on a surface of an object.

12 Claims, 4 Drawing Sheets

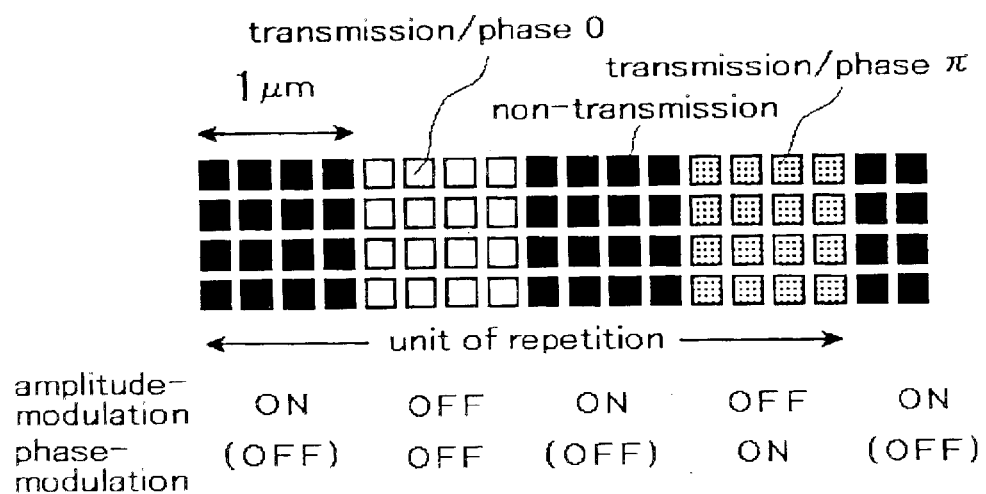
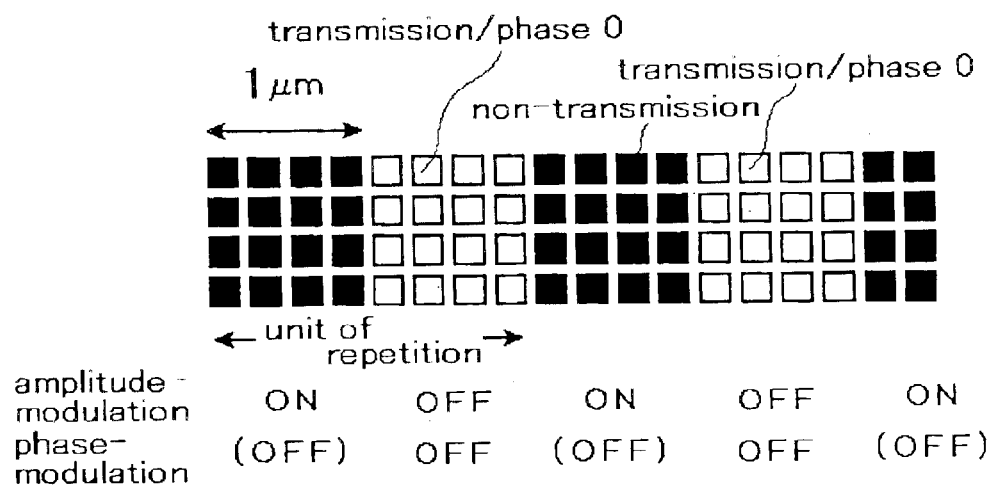

OPTICAL RECORDER AND METHOD THEREOF

BACKGROUND OF THE INVENTION

1. Field of the Invention

This invention relates to an optical recorder and a recording method used in a process of photolithography in producing a semiconductor integrated circuit, a liquid crystal display and the like, and more particularly, to an optical recorder and a recording method suitable for forming an exposure pattern and the like having a line width substantially as large as the wavelength of an exposure light.

2. Description of Related Art

Among optical recorders utilizing exposure, there is an exposure device for imaging an exposure pattern on a surface of an exposed object by a projection optical system such as a lens projection or a mirror projection. However, in case a line width of an exposure pattern is close to the wavelength of an exposure light, the line width was not resolved because of a limitation due to a diffraction of light. In order to settle this problem, there is provided a method which makes the resolution better by using as an exposure mask a phase-shift mask with a transparent or translucent phase-modulated layer called shifter formed on a mask base to modulate the phase of light in the phase-modulated layer, thereby to better the resolution.

There is another exposure device, i.e., a laser picturing device, which exposes an exposed object while continuously or intermittently scanning on the surface of the exposed object with a laser beam according to an exposure pattern to be recorded. Further, there is a laser picturing device which uses a spatial light modulator for modulating the amplitude of a light to image an exposure pattern formed in the spatial light modulator on an exposed object. This can simultaneously record an exposure pattern at a plurality of positions by the spatial light modulator for amplitude modulation, so that it is advantageous for realizing speeding up of picturing in comparison with a case of scanning with a single beam.

However, in a phase-shift mask, it is necessary to form a phase-modulated layer with a highly accurate thickness on a mask base, and in case the phase-modulated layer and an amplitude-modulated layer of a patterned chrome film or the like are combined, it is necessary to overlap the phase-modulated layer and the amplitude-modulated layer with high accuracy, so that it is more difficult to manufacture the phase-shift mast than an ordinary exposure mask and caused an increase in a manufacturing cost. Further, it was necessary to manufacture a phase-shift mask for each pattern.

Also, the laser picturing device using a spatial light modulator for amplitude modulation can draw a picture, but was inferior with respect to resolution to a device using a phase-shift mask.

SUMMARY OF THE INVENTION

An object of the present invention lies in providing an optical recorder and a method thereof, by which, even if the line width of an exposure pattern is close to the wavelength of an exposure light, a predetermined resolution can be obtained and, besides, the time required for exposing is reduced.

The optical recorder of the present invention comprises: light converting means for converting a light from a light source into a modulated light including an amplitude-modulated light and a phase-modulated light; and imaging means for forming an image of said modulated light on a surface of an object.

The optical recording method of the present invention comprises: a step for converting a light from a light source into a modulated light including an amplitude-modulated light and a phase-modulated light; and a step for forming an image of said modulated light on a surface of an object.

In such a recorder and a method, a modulated light including an amplitude-modulated light and a phase-modulated light is imaged on a surface of an object to be exposed. Therefore, in recording an exposure pattern by exposure on the object, the amplitude-modulation and the phase-modulation can be performed at the same time, thereby easily realizing a high resolution like a phase-shift mask and reduction in exposure time. Since it is easy to control an amount of modulation, modulations of a phase and an amplitude can be readily set to an optimum amount. Also, there is fundamentally no need, as heretofore, to exchange exposure masks every time the exposure pattern is changed.

The light converting means preferably includes: a first spatial light modulator for amplitude-modulation of at least a part of the light introduced from the light source; a first imaging optical system for forming an image of a light modulated in the first spatial light modulator; and a second spatial light modulator for phase-modulation of at least a part of a light imaged by the first imaging optical system, and the imaging means includes a second imaging optical system for forming an image of a light modulated in the second spatial light modulator on the surface of the object.

The light converting means could include: a first spatial light modulator for phase-modulation of at least a part of the light introduced from the light source; a first imaging optical system for forming an image of a light modulated in the first spatial light modulator; and a second spatial light modulator for amplitude-modulation of at least a part of a light imaged by the first imaging optical system; and the imaging means includes a second imaging optical system for forming an image of a light modulated in the second spatial light modulator on the surface of the object.

The light converting means could include: light splitting means for optically splitting the light introduced from the light source into a first light and a second light; a first spatial light modulator for amplitude-modulation of at least a part of the first light; a second spatial light modulator for phase-modulation of at least a part of the second light; and light combining means for optically combining a light modulated in the first spatial light modulator and a light modulated in the second spatial light modulator, and the imaging means includes an imaging optical system for forming an image of a light composed by the light combining means on the surface of the object.

The spatial light modulator for amplitude-modulation can preferably include a polarizing plate and a liquid crystal spatial light modulation element. Also, the spatial light modulator for modulating the phase can preferably include a liquid crystal spatial light modulation element.

The imaging optical system for forming an image on the surface of the object can preferably be a reducing optical system.

The converting step can preferably include: a step for making the light from the light source enter a first spatial light modulator for amplitude-modulation of at least a part of the light from the light source; a step for forming an image of a light modulated in the first spatial light modulator by a first image optic means; and a step for making a light imaged by the first imaging optical system enter a second spatial light modulator for phase-modulation of at least a part of the light imaged, and the said imaging step includes a step for forming an image of a light modulated in the second spatial light modulator on the surface of the object.

The converting step may include: a step for making the light from the light source enter a first spatial light modulator for phase-modulation of at least a part of said light from the light source; a step for forming an image of a light modulated in the first spatial light modulator by a first imaging optical system; and a step for making a light imaged by the first imaging optical system enter a second spatial light modulator for amplitude-modulation of at least a part of the light imaged, and the imaging step includes a step for forming an image of a light modulated in the second spatial light modulator on the surface of the object.

The converting step may include: a step for optically splitting the light from the light source into a first light and a second light by a light splitting means; a step for making the first light enter a first spatial light modulator for amplitude-modulation of at least a part of the first light; a step for making the second light enter a second spatial light modulator for phase-modulation of at least a part of the second light; and a step for optically combining a light modulated in the first spatial light modulator and a light modulated in the second spatial light modulator by a light combining means, and the imaging step includes a step for forming an image of a light composed by the light combining means on the surface of the object.

In the recording method of the present invention, a final exposure pattern is formed by forming an image of the modulated light on the surface of the object as the modulated light is continuously or intermittently scanned, accompanying with changing an exposure pattern formed by the light conversion and a location where the surface of the object is to be exposed.

BRIEF DESCRIPTION OF THE DRAWINGS

FIGS. 4(a) and 4(b) are views showing patterns, FIG. 4(a) being a view showing a test pattern and FIG. 4(b) being a view showing a test pattern for comparison.

PREFERRED EMBODIMENTS OF THE INVENTION

First, in the following is explained a multiplication-type optical recorder optically combining a spatial light modulator for amplitude-modulation and a spatial light modulator for phase-modulation in series and a method thereof.

Figure 1:
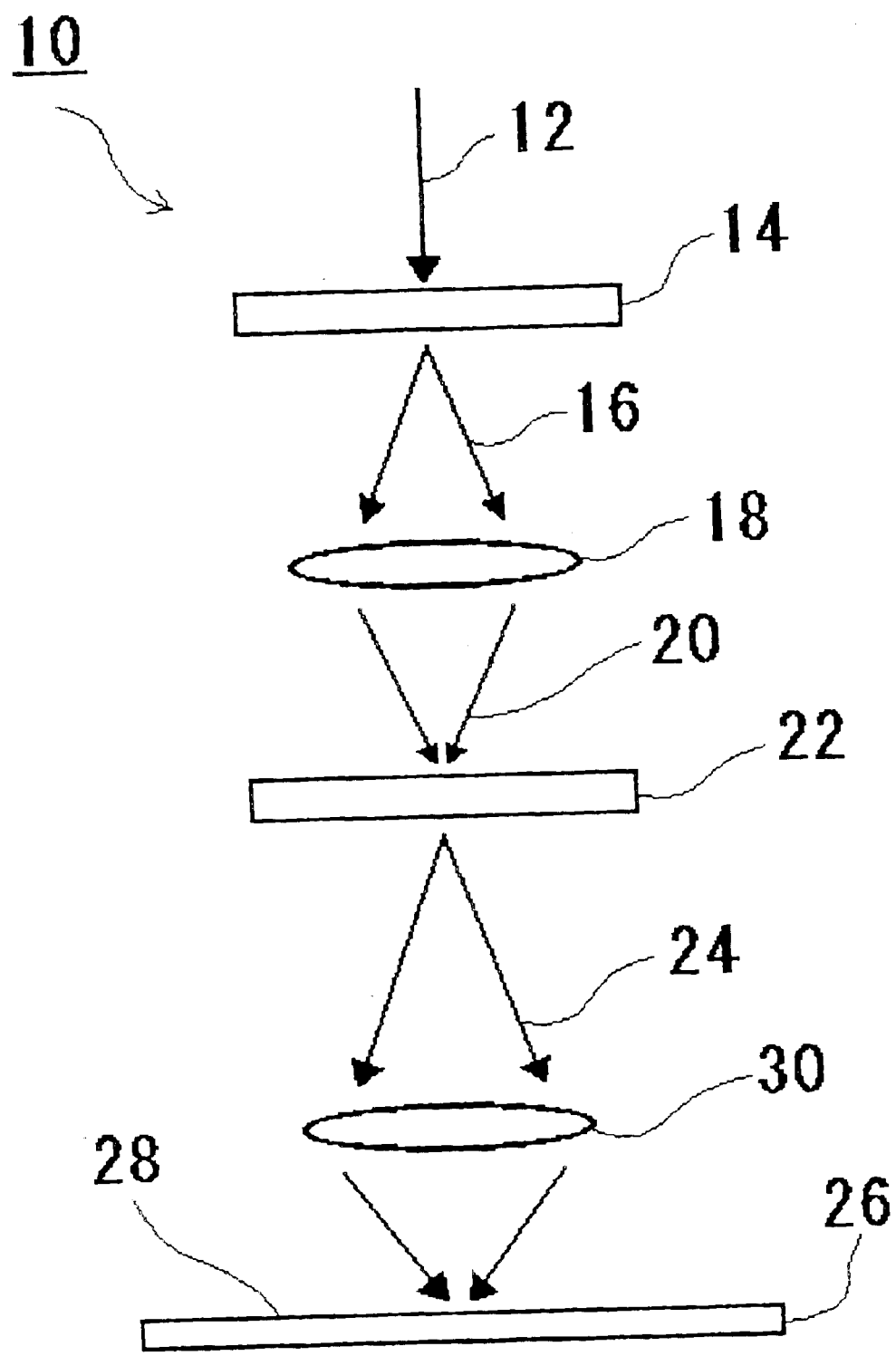
FIG. 1 is a view showing an embodiment of the optical recorder according to the present invention.

Referring to FIG. 1, the optical recorder 10 comprises: a spatial light modulator 14 (hereinafter to be called "SLM") for amplitude-modulation of at least a part of a light 12 introduced from a light source (not shown); an imaging lens 18 for forming an image of a light 16 having transmitted through the spatial light modulator 14; a spatial light modulator 22 for phase-modulation of at least a part of a light 20 imaged by the imaging lens 18; and an imaging lens 30 for forming an image of a light 24 having transmitted through the spatial light modulator 22 on a surface 28 of an object 26 to be exposed.

As a light source for exposure, as in case of an ordinary projection exposure device, an i-line and a g-line of an extra high pressure mercury lamp or various kinds of laser light can be used. Therefore, the optical recorder 10 can be used as an exposure device.

Each SLM 14, 22 includes liquid crystal elements with basic elements each corresponding to a picture element arrayed, and is manufactured by employing a technique for manufacturing a semiconductor integrated circuit and a liquid crystal display panel.

The SLM's 14 and 22 are supported by a supporting device (not shown) in the recorder 10 so as to be arranged optically in series and to be located optically in conjugation to each other. It is necessary that the optical path length between the corresponding picture elements of the SLM 14 and the SLM 22, that is, the phase difference should not greatly change in the vicinity of each picture element. If it is possible to ignore the aberration of the imaging lens 18, this condition can be attained by controlling a delay in position in an optic axial direction between the SLM 14 and the SLM 22 to be sufficiently small in comparison with the wavelength of the exposure light in the vicinity of each picture element.

Suppose a complex amplitude transmittance is $T_1(x, y)$ in the SLM 14 and a complex amplitude transmittance is $T_2(x, y)$ in the SLM 22, a complex amplitude $E(x, y)$ on the surface 28 of the object 26 is expressed by the following expression (1).

[Formula 1]

$$E(x, y) = T_1(x, y)T_2(x, y) = A_1(x, y)A_2(x, y)\exp(iP_1(x, y) + iP_2(x, y)) = A(x, y)\exp(iP(x, y)) \qquad (1)$$

Here, $T_1(x, y)$ and $T_2(x, y)$ are defined in the following expressions (2) and (3).

[Formula 2]

$$T_1(x, y) = A_1(x, y)\exp(iP_1(x, y)) \qquad (2)$$

[Formula 3]

$$T_2(x, y) = A_2(x, y)\exp(iP_2(x, y)) \qquad (3)$$

Based on the above expressions (1), (2) and (3), the amplitude-modification (the transmittance of light) and the phase modulation (phase 0 to phase $2\pi$) are controlled at the applied voltage to the liquid crystal element so that the above-mentioned amplitude $A(x, y)$ and phase $P(x, y)$ may become the final amplitude $A(x, y)$ and phase $P(x, y)$ on the surface 28 of the exposed object 26.

Even when the SLM 14 for amplitude-modulation has a phase-modulating effect and/or when the SLM 22 for phase-modulation has an amplitude-modulating effect, the values of $T_1(x, y)$ and $T_2(x, y)$ can be selected so that the final amplitude $A(x, y)$ and phase $P(x, y)$ may approach ideal values.

For the imaging lens 30, either of an optical lens of the unit magnification and a reducing optical lens can be adopted. However, the size of the SLM picture element is generally as great as or greater than several $\mu$m, so that, to obtain a resolution in the order of so-called submicron, use of a reducing optical lens is preferred. In FIG. 1, the imaging lenses 18, 30 are respectively shown as one lens to simplify the explanation, but to obtain more favorable imaging performance, it is desirable to use plural lenses and combine them.

In FIG. 1, a case of disposing the SLM for amplitude-modulation on the side of the light source and the SLM for phase-modulation on the side of the exposed object, but the same applies even in case the SLM for phase-modulation is disposed on the side of the light source and the SLM for phase-modulation is disposed on the side of the exposed object. Further, a spatial light modulator other than liquid crystal element can be used.

Next, let us explain an addition-type optical recorder and a method in which the spatial light modulator for amplitude-modulation and the spatial light modulator for phase-modulation are optically connected in parallel.

Figure 2:
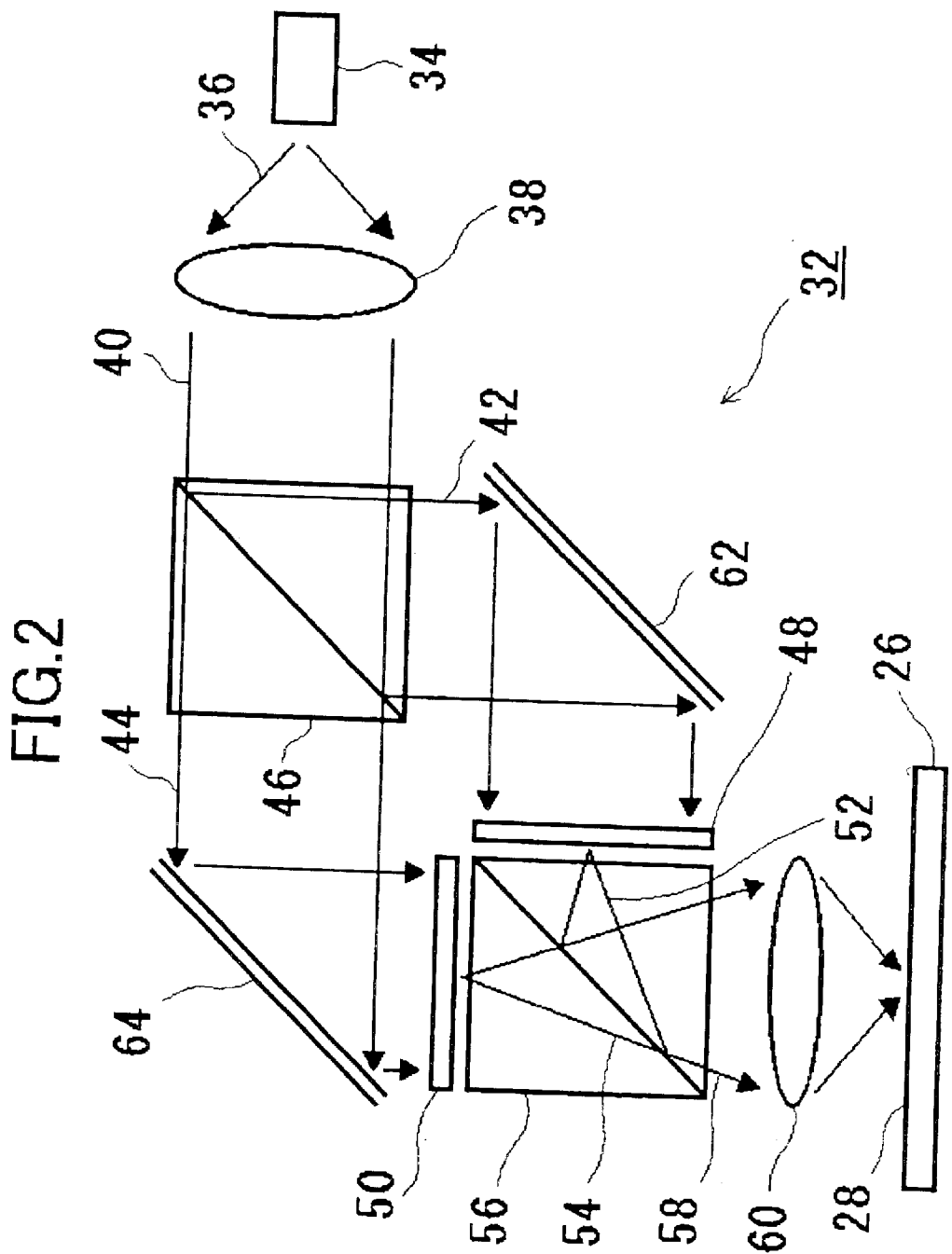
FIG. 2 is a view showing another embodiment of the optical recorder according to the present invention.

Referring to FIG. 2, an optical recorder 32 comprises: a light separator 46 for optically splitting a light 44 having passed through an illuminating lens 38 from a light source 34 into a light 42 and a light 44; an SLM 48 for amplitude-modulation of at least a part of the light 42; an SLM 50 for phase-modulation of at least a part of the light 44; a light combiner 56 for optically combining the light 52 having transmitted the SLM 48 and the light 54 having transmitted the SLM 50; and an imaging lens 60 for forming an image of a composed light 58 on the surface 28 of the object 26.

Also, there are provided a mirror 62 reflecting and leading the light 42 from the light separator 46 to the SLM 48 and a mirror 64 for reflecting and leading the light 44 from the light separator 46 to the SLM 50.

As a light source for exposure, like an ordinary stepper, a laser beam such as an i-line and a g-line respectively of an extra high pressure mercury lamp, or an ArF laser (wavelength=248 mm), a KrF laser (wavelength=193 mm) or the like can be used.

Each SLM 48, 50 contains liquid crystal elements with basic elements each corresponding to a picture element arrayed, and is manufactured by using a technique of manu-facturing a semiconductor integrated circuit and a liquid crystal display panel.

Both SLM 48 and SLM 50 are supported in the recorder 32 by a supporting device (not shown) optically in parallel and so as to overlap at positions as viewed from the image optical system or the imaging lens 60. Since a delay in position in the optic axial direction between the SLM 14 and the SLM 22 is caused as a phase difference corresponding thereto, that is, a difference between $P_1$ (x, y) and $P_2$ (x, y), positioning is made highly accurately in comparison with a multiplication-type optical system.

For the light separator 46 and the light combiner 56, halfmirror-type optical elements are used. In light composition, the light having transmitted the SLM 48 and the light having transmitted the SLM 50 are interfered by the light combiner 56. Since the directions of polarization should be the same, a polarized beam splitter is not used.

Suppose the complex amplitude transmittance in the SLM 48 is $T_1$ (x, y) and the complex amplitude transmittance in the SLM 50 is $T_2$ (x, y), a complex amplitude E (x, y) on the surface 28 of the object 26 is expressed by the following expression (4):
[Formula 4]

$$E(x, y)=T_1(x, y)+T_2(x, y)=A_1(x, y)\exp(iP_1(x, y))+A_2(x, y)\exp(iP_2(x, y))=A(x, y)\exp(iP(x, y)) \quad (4)$$

Here, $T_1$ (x, y) and $T_2$ (x, y) are defined in the following expressions (5) and (6).
[Formula 5]

$$T_1(x, y)=A_1(x, y)\exp(iP_1(x, y)) \quad (5)$$

[Formula 6]

$$T_2(x, y)=A_2(x, y)\exp(iP_2(x, y)) \quad (6)$$

Based on the above expressions (4), (5) and (6), the amplitude-modulation (light transmittance) and the phase-modulation (phase 0 to phase $2\pi$) are controlled at an applied voltage to the liquid crystal elements so that the above-mentioned amplitude A (x, y) and phase P (x, y) may become the final amplitude A (x, y) and phase P (x, y) on the surface 28 of the exposed object 26.

Even in cases where the SLM 48 for amplitude-modulation has a phase-modulation effect and where the SLM 50 for phase-modulation has an amplitude-modulation effect, it suffices to select the values of $T_1$ (x, y) and $T_2$ (x, y) so that the final amplitude A (x, y) and phase P (x, y) may approach an ideal value by the expression (4).

While the amounts of amplitude-modulation and the phase-modulation can take arbitrary values, as a typical method, they can be controlled to any one of light transmission (hereinafter called "OFF"), non-transmission (hereinafter called "ON") and semitransmission. Also, in phase-modulation, they are controlled to either of phases having no delay (hereinafter called "phase 0" or "OFF") or of phase being delayed by $\pi$ (hereinafter called "phase $\pi$" or "ON").

Consequently, at least four cases, i.e., "non-transmission," "semitransmission and phase $\pi$," "transmission and phase 0" and "transmission and phase $\pi$" can be selected for the picture element of each liquid crystal element as a basic unit for modulation. By combining these cases, a wavefront based upon an arbitrary phase-shift mask can be formed. Here, "non-transmission," "transmission and phase 0" and "transmission and phase $\pi$" correspond to a Levenson-type phase-shift mask, and "semitransmission and phase $\pi$" and "transmission and phase 0" correspond to a halftone-type phase-shift mask.

In FIG. 2, for simplification, there is shown one lens 60 for forming an image of a light on the surface of the object by combining the light having passed two SLM's 48 and 50, but a plurality of lenses may be used to eliminate aberration. Also, by employing a bi-telecentric and a focal optical system, there is such an advantage as, even in case of being out of focus, accuracy in dimension of an exposure pattern is kept and, besides, an even intensity in exposure can be obtained.

Also, by employing a Koehler illumination optical system, a fly-eye lens or the like as an illumination optical system, an even illuminance can be obtained, and it is desirable because the illuminated principal ray can be made vertical to a plane of incidence of light of the SLM on the entire surface. Especially, by using the liquid crystal element for the SLM, since the liquid crystal element greatly changes in characteristic depending on the angle of incidence, a vertical illumination is particularly desirable. As explained in the case of using the transmission-type liquid crystal element as the spatial light modulator, it is possible to use elements other than this, e.g., a reflection-type liquid crystal element, a micromirror device and the like.

Figure 3:
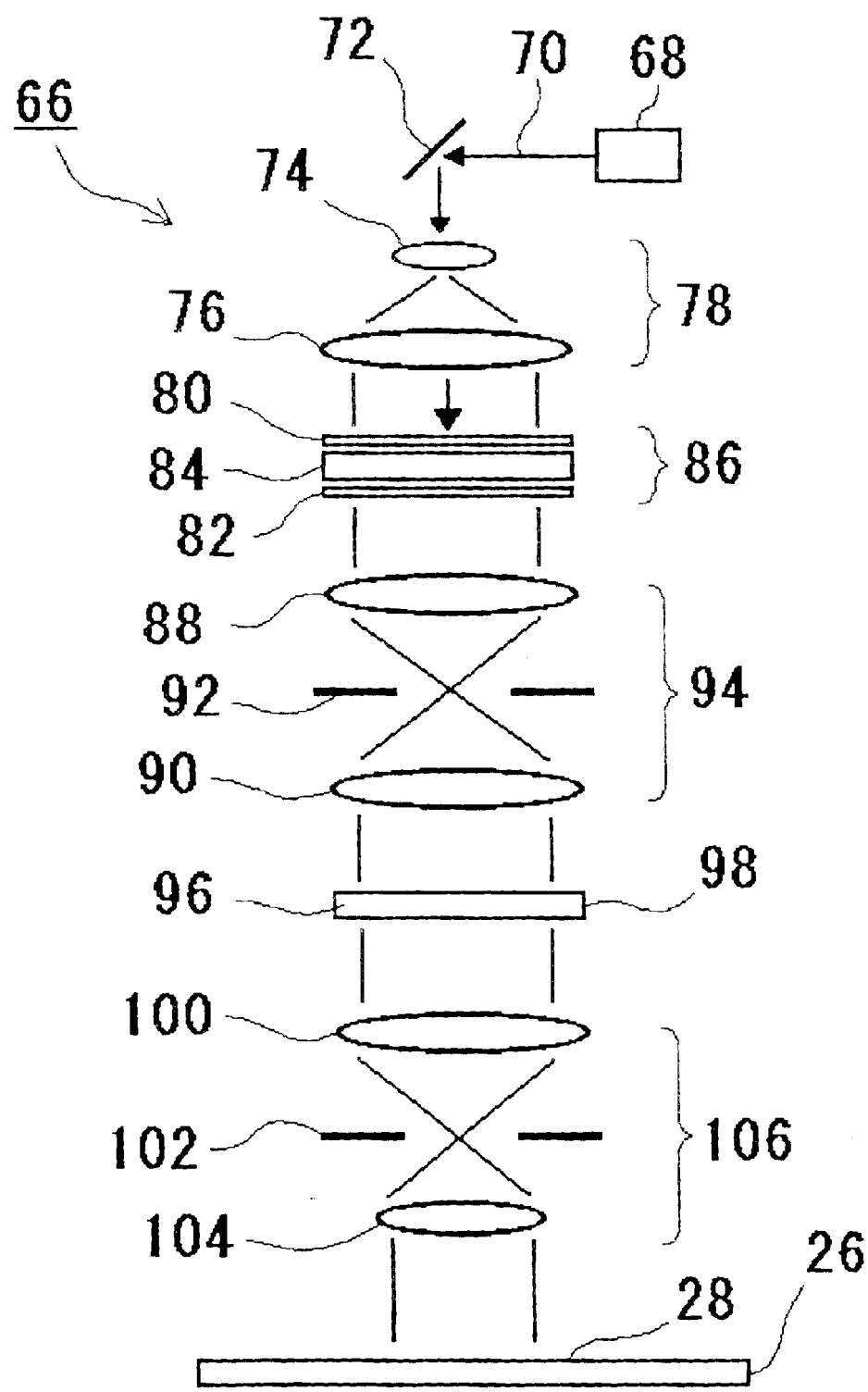
FIG. 3 is a view showing an embodiment of the optical recorder according to the present invention.

FIG. 3 shows the multiplication-type optical system more concretely. A recorder 66 comprises: a light source 68; a mirror 72 reflecting a light 70 from the light source 68; an illumination optical system 78 including illuminating lenses 74, 76; a spatial light modulator 86 including polarizing plates 80, 82 and a liquid crystal element 84; an equimagnification optical system 94 including optical lens of unit magnification lenses 88, 90 and a diaphragm plate 92; a spatial light modulator 98 including a liquid crystal element 96; and a reducing optical system 106 including a unit magnification lens 100, a diaphragm 102 and a reducing glass 104.

An Ar laser (364 nm) was used as a light source. This laser beam was expanded to a parallel light of approximately 50 mm in diameter by a beam expander.

The spatial light modulator 86 is a spatial light modulator for amplitude-modulation of an incident light and has two polarizing plates 80, 82 disposed on both surfaces of a transmissive twisted nematic alignment-type (TN-alignment) liquid element 84 with their axes of polarization intersected at right angles to each other. This spatial light modulator is called normally white type, and it is a spatial light modulator which shows non-transmissive property when an applied voltage signal to the liquid crystal element 84 is ON.

As the liquid crystal element 84, one having a diagonal of 1.2 inches, the number of pixels of 1024×768 and a pixel size of 25 μm square was used. This liquid crystal element was produced to have the thickness of the liquid crystal of 3.1 μm so that, when the applied voltage signal is ON/OFF, the phase difference may become 0.

It is, however, difficult to control the phase difference completely to 0, and some phase difference is generated. As mentioned later, this phase difference is compensated by a spatial light modulator for phase-modulation.

For the spatial light modulator 98, which is a spatial light modulator to modulate the phase of an incident light, a homogeneous alignment-type liquid crystal element was used as the liquid crystal 96. It is a principle of phase modulation that, when a liquid crystal having an anisotropic refractive index changes directions by an electric field, a refractive index changes relative to a light of a specific polarization direction, thereby changing the phases after transmitting a liquid crystal having a certain thickness.

The liquid crystal element 96 was produced to have the refractive index anisotropy Δn of the liquid crystal of 0.08 and the thickness of 3.1 μm. The phase-modulation on the assumption that a director completely changes by 90° between ON and OFF of the applied voltage signal is expressed by the following expression (7), on which condition an arbitrary phase amount can be set.

[Formula 7]

$$(\text{Maximum phase modulation})=2\pi\times(\text{refractive index anisotropy } \Delta n)\times(\text{thickness of liquid crystal})/(\text{wavelength/refractive index})= 2\pi\times0.08\times3.1\ \mu m/(0.364\ \mu m/1.5)=2\pi \quad (7)$$

In the spatial light modulator 98 for phase-modulation, no polarizing plate was used, and the alignment of the liquid crystal is made a homogeneous alignment. Also, the liquid crystal was made 3.1 μm thick. The phase difference becomes 2π in case of completely aligned vertically when the applied voltage signal is ON. The relation between the applied voltage and the phase-modulation amount was previously obtained to perform the ON/OFF control of the applied voltage.

As an imaging optical system, an a focal and telecentric optical system with a reduction ratio of 1/100 and a numerical aperture (NA) of 0.18 was used. The pixel size on the surface of the exposed object became 0.25 μm square.

As an exposure pattern to be recorded by exposure, a Shibuya-Levenson-type line and space of 1.0 μm (hereinafter called "L and S") was used to expose an exposed object. As an exposure pattern for comparison, L and S test pattern of 1.0 μm of only amplitude-modulation was used to expose an exposed object. Each pattern is shown in FIGS. 4(a) and 4(b). A unit square represents one picture element of the SLM. The dimension is the value on the image plane.

In the amplitude modulation, "OFF" shows transmission of light, and "ON" shows non-transmission. In the phase-modulation, "OFF" shows that the phase is the same (phase 0), and "ON" shows that the phase is delayed by π (phase π). The phase-modulation of a part where the amplitude is non-transmissive may be either ON or OFF. "ON" in the phase π shows that a voltage at which the phase-modulation becomes π was applied. The positions of ON and OFF in the phase 0 and the phase π may be the reverse.

Silicon wafer was used as a base of an object to be exposed, photoresist THMR-iP5700 made by Tokyo Oka Kogyo being applied to the silicon wafer to be 1.0 μm thick. Therefore, in this example, the photoresist is used as an object to be exposed.

The photoresist surface was exposed with 40 mJ/cm² exposure.

The exposed photoresist was developed to observe a pattern formed on the photoresist. In a test pattern (L and S test pattern of only amplitude-modulation) for comparison, there was an unevenness in line width of those resolved; however, in the Shibuya-Levenson type L and S test pattern, an even line width was obtained, and a favorable resolution was observed.

The present invention is not limited to the above embodiments but can be variously modified without departing from the spirit of the invention. While in the embodiment the "Shibuya-Levenson type" was given as an example of a phase-shift mask, any other type used for a phase-shift mask in general can be used. For example, "auxiliary shifter type," "edge enhancement type," "shifter edge utilization type," "multistage shifter type," and "halftone type" can be used.

What is claimed is:

1. An optical recorder, comprising:

a light converter for converting a light from a light source into a modulated light including an amplitude-modulated light and a phase-modulated light; and an image former for forming an image of said modulated light on a surface of an object, wherein said light converter comprises a first spatial light modulator for amplitude-modulation of at least a part of the light introduced from said light source; a first imaging optical system for forming an image of a light modulated in said first spatial light modulator; and a second spatial light modulator for phase-modulation of at least a part of a light imaged by said first imaging optical system; and wherein said image former comprises a second imaging optical system for forming an image of light modulated in said second spatial light modulator on the surface of said object.

2. An optical recorder, comprising:

a light converter for converting a light from a light source into a modulated light including an amplitude-modulated light and a phase-modulated light; and an image former for forming an image of said modulated light on a surface of an object, wherein said light converter comprises a light splitter for optically splitting the light introduced from said light source into a first light and a second light; a first spatial light modulator for amplitude-modulation of at least a part of said first light; a second spatial light modulator for phase modulation of at least a part of said second light; and a light combiner for optically combining a light modulated in said first spatial light modulator and a light modulated in said second spatial light modulator; and wherein said image former comprises an imaging optical system for forming an image of a light composed by said light combiner on the surfaces of said object.

3. An optical recorder, comprising:

a light converter for converting a light from a light source into a modulated light including an amplitude-modulated light and a phase-modulated light; and image former for forming an image of said modulated light on a surface of an object, wherein said light converter includes: a first spatial light modulator for amplitude-modulation of at least a part of the light introduced from said light source; a first imaging optical system for forming an image of a light modulated in said first spatial light modulator; and a second spatial light modulator for phase-modulation of at least a part of a light imaged by said first imaging optical system; wherein said image former includes a second imaging optical system for forming an image of a light modulated in said second spatial light modulator on the surface of said object, and wherein said spatial light modulator for amplitude-modulation includes a polarizing plate and a liquid crystal spatial light modulation element.

4. An optical recorder, comprising: a light converter for converting a light from a light source into a modulated light including an amplitude-modulated light and a phase-modulated light; and image former for forming an image of said modulated light on a surface of an object, wherein said light converter includes: a first spatial light modulator for amplitude-modulation of at least a part of the light introduced from said light source; a first imaging optical system for forming an image of a light modulated in said first spatial light modulator; and a second spatial light modulator for phase-modulation of at least a part of a light imaged by said first imaging optical system; wherein said image former includes a second imaging optical system for forming an image of a light modulated in said second spatial light modulator on the surface of said object, and wherein said spatial light modulator for phase-modulation includes a liquid crystal spatial light modulation element.

5. An optical recorder, comprising:

a light converter for converting a light from a light source into a modulated light including an amplitude-modulated light and a phase-modulated light; and image former for forming an image of said modulated light on a surface of an object, wherein said light converter includes: a first spatial light modulator for amplitude-modulation of at least a part of the light introduced from said light source; a first imaging optical system for forming an image of a light modulated in said first spatial light modulator; and a second spatial light modulator for phase-modulation of at least a part of a light imaged by said first imaging optical system; wherein said image former includes a second imaging optical system for forming an image of a light modulated in said second spatial light modulator on the surface of said object, and wherein said imaging optical system for forming an image on the surface of said object is a reducing optical system.

6. An optical recording method, comprising:

converting a light from a light source into a modulated light including an amplitude-modulated light and a phase-modulated light; and forming an image of said modulated light on a surface of an object, wherein said converting step includes: making the light from said light source enter a first spatial light modulator for amplitude-modulation of at least a part of said light from said light source; forming an image of a light modulated in said first spatial light modulator by a first imaging optical system; and making a light imaged by said first imaging optical system enter a second spatial light modulator for phase-modulation of at least a part of said light imaged; and wherein said imaging step includes forming an image of a light modulated in said second spatial light modulator on the surface of said object.

7. An optical recording method, comprising:

a step for converting a light from a light source into a modulated light including an amplitude-modulated light and a phase-modulated light; and forming an image of said modulated light on a surface of an object, wherein said converting step includes: optically splitting the light from said light source into a first light and a second light by a light splitter; making said first light enter a first spatial light modulator for amplitude-modulation of at least a part of said first light; making said second light enter a second spatial light modulator for phase-modulation of at least a part of said second light; and optically combining a light modulated in said second spatial light modulator by a light combiner; wherein said imaging step includes forming an image of a light composed by said light combiner on the surface of said object.

8. An optical recording method, comprising:

converting a light from a light source into a modulated light including an amplitude-modulated light and a phase-modulated light; and a step for forming an image of said modulated light on a surface of an object, wherein said converting step includes: making the light from said light source enter a first spatial light modulator for amplitude-modulation of at least a part of said light from said light source; forming an image of a light modulated in said first spatial light modulator by a first imaging optical system; and making a light imaged by said first imaging optical system enter a second spatial light modulator for phase-modulation of at least a part of said light imaged; wherein said imaging step includes forming an image of a light modulated in said second spatial light modulator on the surface of said object, and wherein a final exposure pattern is formed by forming an image of said modulated light on the surface of said object as said modulated light is continuously or intermittently scanned, accompanying with changing an exposure pattern formed by said light conversion and a location where the surface of said object is to be exposed.

9. An optical recorder comprising:

a light converter for converting a light from a light source into a modulated light including an amplitude-modulated light and a phase-modulated light; and image former for forming an image of said modulated light on a surface of an object, wherein said light converter includes: a light splitter for optically splitting the light introduced from said light source into a first light and a second light; a first spatial light modulator for amplitude-modulation of at least a part of said first light; a second spatial light modulator for phase-modulation of at least a part of said second light; and a light combiner for optically combining a light modulated in said first spatial light modulator and a light modulated in said second spatial light modulator; wherein said image former includes an imaging optical system for forming an image of a light composed by said light combiner on the surface of said object, and wherein said spatial light modulator for amplitude-modulation includes a polarizing plate and a liquid crystal spatial light modulation element.

10. An optical recorder comprising:

a light converter for converting a light from a light source into a modulated light including an amplitude-modulated light and a phase-modulated light; and image former for forming an image of said modulated light on a surface of an object, wherein said light converter includes: a light splitter for optically splitting the light introduced from said light source into a first light and a second light; a first spatial light modulator for amplitude-modulation of at least a part of said first light; a second spatial light modulator for phase-modulation of at least a part of said second light; and a light combiner for optically combining a light modulated in said first spatial light modulator and a light modulated in said second spatial light modulator; wherein said image former includes an imaging optical system for forming an image of a light composed by said light combining means on the surface of said object, and wherein said spatial light modulator for phase-modulation includes a liquid crystal spatial light modulation element.

11. An optical recorder comprising:

a light converter for converting a light from a light source into a modulated light including an amplitude-modulated light and a phase-modulated light; and image former for forming an image of said modulated light on a surface of an object, wherein said light converter includes: a light splitter for optically splitting the light introduced from said light source into a first light and a second light; a first spatial light modulator for amplitude-modulation of at least a part of said first light; a second spatial light modulator for phase-modulation of at least a part of said second light; and a light combiner for optically combining a light modulated in said first spatial light modulator and a light modulated in said second spatial light modulator; wherein said image former includes an imaging optical system for forming an image of a light composed by said light combiner on the surface of said object, and wherein said imaging optical system for forming an image on the surface of said object is a reducing optical system.

12. An optical recording method comprising:

converting a light from a light source into a modulated light including an amplitude-modulated light and a phase-modulated light; and forming an image of said modulated light on a surface of an object, wherein said converting step includes: optically splitting the light from said light source into a first light and a second light by a light splitter; making said first light enter a first spatial light modulator for amplitude-modulation of at least a part of said first light; making said second light enter a second spatial light modulator for phase-modulation of at least a part of said second light; and optically combining a light modulated in said first spatial light modulator and a light modulated in said second spatial light modulator by a light combiner; and wherein said imaging step includes a step for forming an image of a light composed by said light combiner on the surface of said object, wherein a final exposure pattern is formed by forming an image of said modulated light on the surface of said object as said modulated light is continuously or intermittently scanned, accompanying with changing an exposure pattern formed by said light conversion and a location where the surface of said object is to be exposed.

* * * * *

UNITED STATES PATENT AND TRADEMARK OFFICE
CERTIFICATE OF CORRECTION

PATENT NO.    : 6,900,827 B2
DATED         : May 31, 2005
INVENTOR(S)   : Yukio Taniguchi It is certified that error appears in the above-identified patent and that said Letters Patent is hereby corrected as shown below:

Column 10,
Line 9, delete -- a step for --

Signed and Sealed this

Ninth Day of August, 2005

JON W. DUDAS
*Director of the United States Patent and Trademark Office*